United States Patent
Narayanan et al.

(10) Patent No.: US 10,460,821 B2
(45) Date of Patent: Oct. 29, 2019

(54) AREA EFFICIENT PARALLEL TEST DATA PATH FOR EMBEDDED MEMORIES

(71) Applicant: Texas Instruments Incorporated, Dallas, TX (US)

(72) Inventors: Prakash Narayanan, Bangalore (IN); Nikita Naresh, Bangalore (IN); Vaskar Sarkar, Bangalore (IN); Rajat Mehrotra, New Delhi (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/896,817

(22) Filed: Feb. 14, 2018

(65) Prior Publication Data

US 2018/0174663 A1    Jun. 21, 2018

Related U.S. Application Data

(63) Continuation of application No. 15/434,717, filed on Feb. 16, 2017, now Pat. No. 9,899,103, which is a
(Continued)

(30) Foreign Application Priority Data

Oct. 30, 2015  (IN) ............................ 5871/CHE/2015

(51) Int. Cl.
   *G11C 29/12*    (2006.01)
   *G11C 29/38*    (2006.01)
(Continued)

(52) U.S. Cl.
   CPC .............. *G11C 29/12* (2013.01); *G11C 29/38* (2013.01); *G11C 29/40* (2013.01); *G11C 2029/0401* (2013.01); *G11C 2029/2602* (2013.01)

(58) Field of Classification Search
   CPC .............................. G11C 7/222; G11C 29/023
(Continued)

(56) References Cited

U.S. PATENT DOCUMENTS

| 6,288,958 B1 | 9/2001 | Suzuki |
| 6,553,527 B1 * | 4/2003 | Shephard, III ..... G01R 31/3187 714/725 |

(Continued)

FOREIGN PATENT DOCUMENTS

EP    1791133 A1    5/2007

OTHER PUBLICATIONS

Nadeau-Dostie et al., "Serial Interfacing for Embedded-Memory Testing", Design & Test of Computers (IEEE, Apr. 1990), pp. 52-63.
(Continued)

*Primary Examiner* — Han Yang
(74) *Attorney, Agent, or Firm* — Kenneth Liu; Charles A. Brill; Frank D. Cimino

(57) ABSTRACT

A built-in self-test (BIST) parallel memory test architecture for an integrated circuit, such as a system-on-a-chip (SoC), is disclosed. A BIST controller generates a test data pattern for memories of a common memory type, with this test data pattern forwarded to the memories, with pipeline delay stages inserted in the data path according to the operational speed of the memory in its normal operation. The expected data response of these memories, when read, and corresponding to this test data pattern is delayed for a group of memories by a local delay response generator shared by those memories. For example, the memories in the group of memories may be physically near one another. The local delay response generator delays the expected data response by a delay corresponding to the memory latency of those
(Continued)

memories in the group, before applying the expected data response to local comparators associated with the memories in the group.

19 Claims, 4 Drawing Sheets

Related U.S. Application Data continuation of application No. 15/066,924, filed on Mar. 10, 2016, now abandoned.

(51) Int. Cl.
*G11C 29/40* (2006.01)
*G11C 29/04* (2006.01)
*G11C 29/26* (2006.01)

(58) Field of Classification Search
USPC .................................. 365/194, 201, 230.03
See application file for complete search history.

(56) References Cited

U.S. PATENT DOCUMENTS

| | | | |
|---|---|---|---|
| 6,934,205 B1 | 8/2005 | Pandey et al. | |
| 7,203,873 B1 | 4/2007 | Adams et al. | |
| 7,305,597 B1 | 12/2007 | Andreev et al. | |
| 7,324,392 B2 | 1/2008 | Ramamurti et al. | |
| 7,325,178 B2 | 1/2008 | Damodaran et al. | |
| 8,843,769 B2 | 9/2014 | Kimelman | |
| 2004/0125667 A1 | 7/2004 | Sadakata et al. | |
| 2008/0040604 A1 | 2/2008 | Okabayashi | |
| 2008/0040640 A1 | 2/2008 | Okabayashi | |
| 2008/0059850 A1 | 3/2008 | Bahl | |
| 2008/0082883 A1 | 4/2008 | Gorman et al. | |
| 2008/0130386 A1 | 6/2008 | Pyeon | |
| 2009/0172487 A1 | 7/2009 | Damodaran et al. | |
| 2009/0313511 A1 | 12/2009 | Goto et al. | |
| 2012/0042220 A1* | 2/2012 | Chakravarty | G11C 29/16 714/719 |
| 2012/0153982 A1 | 6/2012 | Lee | |
| 2014/0164856 A1 | 6/2014 | Damodaran et al. | |
| 2015/0131392 A1 | 5/2015 | Aizawa | |

OTHER PUBLICATIONS

Van De Goor, "Using March Tests to Test SRAMs", Design & Test of Computers (IEEE, Mar. 1993), pp. 8-14.

Jone et al., "An Efficient BIST Method for Small Buffers", Proc. of the 1999 17th IEEE VLSI Test Symposium (IEEE, 1999), p. 246-51.

Cheng et al., "Automatic Generation of Memory Built-In Self-Test Cores for System-on-Chip," Proc. of the 10th Asian Test Symposium (IEEE, 2001), pp. 91-96.

Huang et al., "A Parallel Built-In Self-Diagnostic Method for Embedded Memory Arrays", Trans. on Computer-Aided Design of Integrated Circ. and Sys., vol. 21, No. 4 (IEEE, 2002), pp. 449-465.

Fang et al., "Power-Constrained Embedded Memory BIST Architecture," Proc. of 18th Int'l. Symp. on Defect and Fault Tolerance in VLSI Systems (IEEE, 2003), pp. 451-458.

Aitken, "A Modular Wrapper Enabling High Speed BIST and Repair for Small Wide Memories", ITC Int'l. Test Conf., Paper 35.2 (IEEE, 2004), pp. 997-1005.

Wang et al., "Test/Repair Area Overhead Reduction for Small Embedded SRAMS", Proc. of the 15th Asian Test Symposium (IEEE, 2006).

Denq et al., "A Hybrid BIST Scheme for Multiple Heterogeneous Embedded Memories", Proc. of the 16th Asian Test Symposium (IEEE, 2007), pp. 349-354.

Phelps et al., "The Importance of Functional-Like Access for Memory Test", Int'l Test Conference, Poster 13 (IEEE, 2008), p. 1.

Huang et al., "A Low-Cost Pipelined BIST Scheme for Homogeneous RAMs in Multicore Chips", Proc. of the 17th Asian Test Symposium (IEEE, 2008), pp. 357-362.

PCT/US2016/059796, International Search Report dated Feb. 9, 2017.

European Search Report for PCT/US2016/059796 dated Jan. 29, 2019.

Extended European Search Report for PCT/US2016/059796 dated May 31, 2019.

* cited by examiner

AREA EFFICIENT PARALLEL TEST DATA PATH FOR EMBEDDED MEMORIES

CROSS-REFERENCE TO RELATED APPLICATIONS

This application is a continuation of and claims priority to U.S. patent application Ser. No. 15/434,717, filed Feb. 16, 2017 and now U.S. Pat. No. 9,899,103, which is a continuation of and claims priority to U.S. patent application Ser. No. 15/066,924, filed Mar. 10, 2016, which claims priority to India Provisional Patent Application No. 5871/CHE/2015, filed Oct. 30, 2015, all of which are incorporated herein by reference in their entireties.

STATEMENT REGARDING FEDERALLY SPONSORED RESEARCH OR DEVELOPMENT

Not applicable.

BACKGROUND OF THE INVENTION

This invention is in the field of integrated circuit testing. Embodiments are directed to the testing of embedded memories in large-scale integrated circuits.

Many modern electronic integrated circuits integrate essentially all necessary functional components of a computer system, whether general purpose or arranged for a particular end application. Those large scale integrated circuits that include the computational capability for controlling and managing a wide range of functions and useful applications are often referred to as "system on a chip", or "SoC", devices. Typical modern SoC architectures include one or more processor "cores" that carry out the digital computer functions of retrieving executable instructions from memory, performing arithmetic and logical operations on digital data retrieved from memory, and storing the results of those operations in memory. Other digital, analog, mixed-signal, or even RF functions may also be integrated into the SoC for acquiring and outputting the data processed by the processor cores. In any case, considering the large amount of digital data often involved in performing the complex functions of these modern devices, significant solid-state memory capacity is now commonly implemented in these SoC devices.

In order to optimize performance, memory resources are typically distributed throughout the typical modern SoC device. These memory resources can include both volatile and non-volatile memory. This distributed memory architecture results in memory resources being physically and electrically (or logically) proximate to the processing function that will be accessing it, but may be physically and logically remote from other similar memory of the same type. For example, the deployment of local memory resources will minimize the traffic over the system bus, which reduces the likelihood of bus contention and undesirable latency, and also reduces access time and memory management overhead. The number of memory arrays realized throughout a modern large-scale SoC devices can be quite large, numbering into the hundreds in some cases.

It is of course important to fully test the functionality and performance of integrated circuits at the time of manufacture, especially considering that memory resources can occupy much of the chip area of a typical modern SoC. As known in the art, conventional memory test algorithms can be quite time-consuming, particularly those involving test patterns of order $O(n^x)$ where x is greater than one, and as such the test time and test cost involved can be dominated by memory test. The distribution of embedded memory resources throughout typical SoC devices further complicates the task of memory test, as many memory arrays are not directly accessible to external automated test equipment yet must still be tested.

As known in the art, SoC devices typically include internal test circuitry ("built-in self-test", or "BIST", circuitry) that executes a self-test operation for the device upon power-up or reset. BIST may also be involved in the testing of memory, both at the time of manufacture and also on power-up. Conventional BIST memory test techniques can include the placement of hardwired logic in the SoC, by way of which memory test algorithms developed at the time of circuit design are implemented; however, it may not be feasible to determine the particular tests to be performed at that early stage of the process. Another conventional BIST approach is to use the central processing unit of the SoC itself to perform the memory test. This approach can be limited, however, because not all embedded memory arrays in the device may be visible to the CPU, and are thus not testable by the CPU. Direct memory access (DMA) techniques for providing external access to embedded memories are also known, but typically are unable to access the memory at its full operating speed.

Because of these limitations, programmable BIST ("pBIST") techniques have been developed to test embedded memories in the SoC context. U.S. Pat. No. 7,324,392 and U.S. Patent Application Publication No. US 2014/0164856, both commonly assigned herewith and incorporated herein by reference, describe examples of these pBIST techniques for testing embedded memories in large-scale integrated circuits such as SoC devices. According to these approaches, the pBIST circuitry includes a general purpose test controller that is programmed by a set of instructions to produce test conditions for the various internal and embedded functions of the device, and to receive and log the responses of those functions to those test conditions. In the memory test context, these operations include the writing of the desired data pattern to an embedded memory, and then addressing the memory to retrieve and compare the stored data to the expected data. Typically, the BIST data path over which the data are communicated during memory test is a separate and independent data path from that by which the embedded memories are accessed in normal operation of the SoC.

Because of the high test time and test cost for testing the memory capacity of the SoC device, as discussed above, BIST techniques have been developed for the parallel testing of embedded memories, such that multiple memory arrays are simultaneously tested. According to one conventional approach, this parallel test is implemented by instantiating multiple BIST controllers that simultaneously execute a test of an associated embedded memory. Of course, the provision of multiple BIST controllers multiplies the chip area required for the BIST test logic and data paths, forcing a trade-off between chip area and test time.

Conventional pBIST architectures, such as described in the above-incorporated U.S. Pat. No. 7,324,392, include a BIST controller that is shared by multiple memories of similar memory type (e.g., single-port, double-port, etc.). The shared BIST controller generates the test pattern to be written to the memories, and also the expected response from the memories when read. Each memory has a local comparator that compares the data read from its memory during the test with the expected data from the shared BIST controller, and forwards the results to the shared BIST controller. In order for the expected data from the shared BIST controller to align with the data read from the parallel embedded memories, this conventional arrangement includes a local response delay generator that aligns the expected data to account for access latency for that particular memory, and a local comparator that compares the delayed expected data with the data read from that particular memory and generates a pass/fail signature accordingly.

FIG. 1 illustrates an example of the architecture of a BIST memory test data path in a conventional SoC, in which shared BIST controller 10 supports the parallel test of memories 15 in a manner such as described in the above-incorporated U.S. Pat. No. 7,324,392. This test data path is separate and independent from the data path by way of which memories 15 are accessed in normal operation, which is not shown in FIG. 1 for the sake of clarity. As shown in this example, BIST controller 10 communicates with each memory 15 by way of one or more pipeline delay stages 12, in combination with an instance of local response delay generator 14 that is dedicated to that embedded memory 15. BIST controller 10 may be one of multiple such BIST controllers within the SoC. In architectures such as this example, a given BIST controller 10 is typically associated with memories 15 that are of a common type (e.g., single-port, double-port), considering that BIST controller 10 generates the particular test data pattern to be applied to its associated memories 15; as such, if the SoC includes multiple memory types, multiple BIST controllers 10 and associated data paths may be present. The data pattern generated by BIST controller 10 is applied directly to memories 15, after passing through the pipeline delay stages 12, but these data are not delayed by local response delay generators 14.

In this arrangement, pipeline delays 12 and each local response delay generator 14 delay the expected data response communicated from BIST controller 10 before application to the instance of local comparator 16 with which that local response delay generator 14 is associated. Local comparator 16 compares that delayed expected data response with the data read from its associated memory 15 during the memory test, and generates a pass/fail signature based on the results of that comparison. In this example, the pass/fail signatures generated by comparators 16 are communicated back to BIST controller 10, for example by way of parallel test data comparator 17 function, which produces an overall pass/fail signature for those memories 15 that were tested in parallel.

In this conventional architecture, instances of pipeline delays 12 may be shared by embedded memories 15 that are generally in the vicinity of one another. For example, pipeline delay $12_0$ is shared by all embedded memories 15 shown in FIG. 1, while pipeline delay $12_1$ is shared by embedded memories 15 of group $18_1$ that are in the general vicinity of one another, and pipeline delay $12_2$ is shared by embedded memories 15 in group $18_2$ that are in the general vicinity of one another. Each of pipeline delays 12 essentially operate as one or more clocked buffer stages for the data communicated by BIST controller 10, such that a data word applied at the input of an instance of pipeline delay 12 will appear at its output after a delay of x clock cycles, where x is the number of buffer stages in that pipeline delay 12. Each local response delay generator 14 is similarly constructed, and operates to delay the expected data it receives by one or more clock cycles, so as to align it with the memory access latency of its associated embedded memory 15.

While the pipeline architecture in this conventional arrangement is "physically aware" by sharing pipeline stages 12 based on the general physical proximity of embedded memories 15, dedicated local response delay generators 14 must still be provided in this architecture. These dedicated local response delay generators 14 can each occupy significant chip area, especially in the case of very wide data words (e.g., up to 128 bit) that are now often required in many modern SoC devices. In some cases, particularly those in which the overall chip area of the SoC is constrained by packaging considerations and other constraints, the chip area consumed by these dedicated local response delay generators can be prohibitive, such that parallel memory test cannot be implemented.

BRIEF SUMMARY

Disclosed embodiments provide a built-in self-test (BIST) architecture for the parallel test of distributed memories in a large-scale integrated circuit can be implemented with reduced chip area.

Disclosed embodiments provide such a BIST parallel memory test architecture that is suitable for implementation in system-on-a-chip (SoC) devices.

Disclosed embodiments provide such a BIST parallel memory test architecture that enables parallel test of embedded memories at full operating speed.

Other objects and advantages of the disclosed embodiments will be apparent to those of ordinary skill in the art having reference to the following specification together with its drawings.

According to certain embodiments, a large-scale integrated circuit such as an SoC includes a BIST controller that generates test data patterns to be applied to a plurality of embedded memories by way of a BIST data path. Each embedded memory is coupled to a dedicated local comparator that compares data read from the memory during test with an expected data response forwarded from the BIST controller. The local comparators associated with a group of the plurality of memories to be tested in parallel receive the expected data response in parallel from a local response delay generator that is shared among the group.

DETAILED DESCRIPTION

The embodiments described in this specification are implemented into a large-scale integrated circuit device including a number of computing and other operational functions, such as those integrated circuits commonly referred to as a "system-on-a-chip" or "SoC", as it is contemplated that such implementation is particularly advantageous in that context. However, it is also contemplated that concepts of this invention may be beneficially applied to in other applications, for example any type of integrated circuit in which a number of memory arrays are embedded at various locations within the device. Accordingly, it is to be understood that the following description is provided by way of example only, and is not intended to limit the true scope of this invention as claimed.

Figure 2:
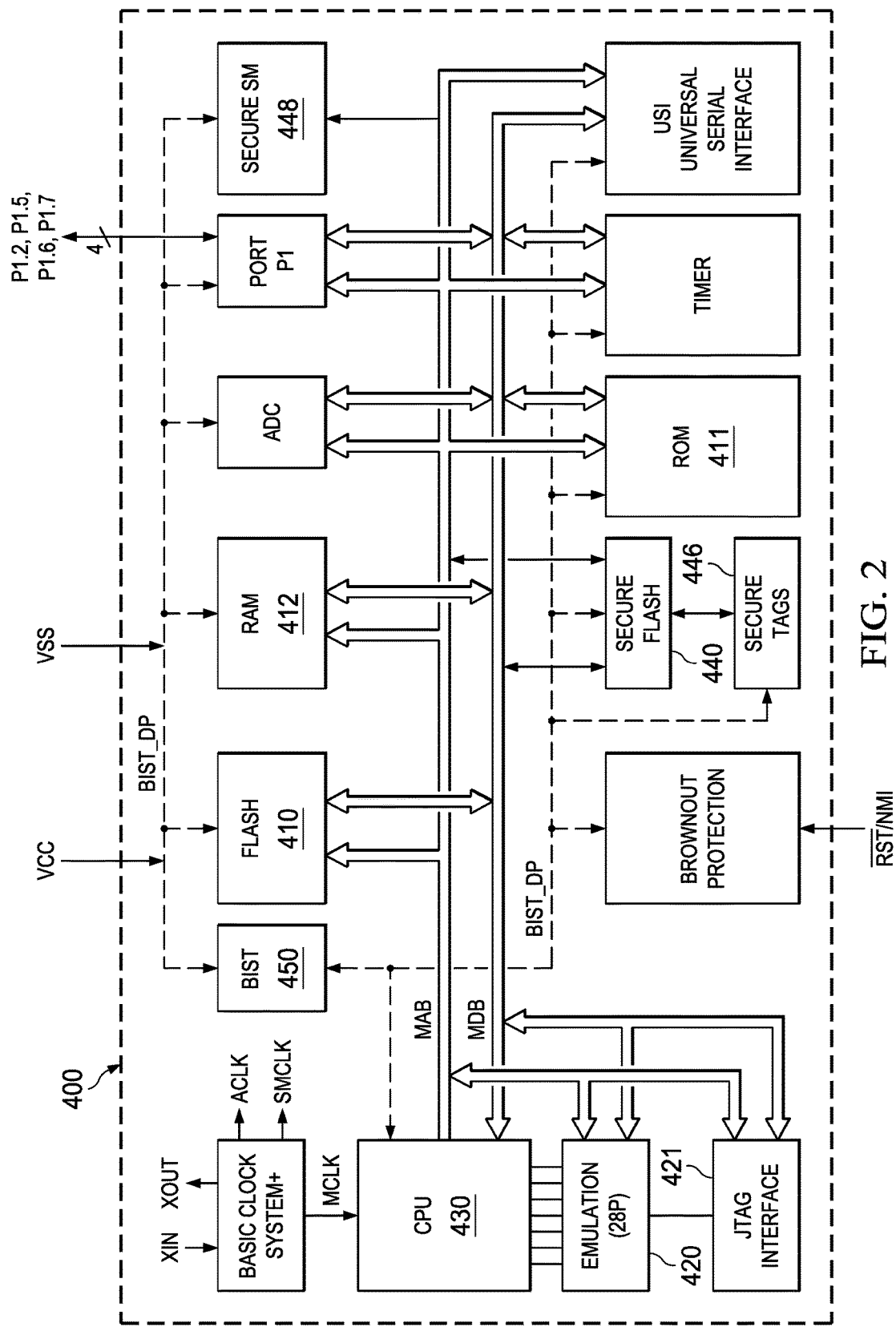
FIG. 2 is an electrical diagram, in block form, of the architecture of an SoC device constructed according to embodiments.

FIG. 2 illustrates, in block diagram form, the generalized architecture of SoC 400 constructed according to these embodiments. In this example, programmable logic serving as the central processing unit (CPU) of SoC 400 is provided by CPU 430, which may be realized, for example, by a microprocessor such as an OMAP processor available from Texas Instruments Incorporated. As known in the art, SoC 400 may be constructed to include multiple CPUs 430, which may be of the same type as one another or which may be processors of other types such as generic programmable processors, digital signal processors (DSPs) or other application-specific or customized logic, including fixed sequence generators, as appropriate for the particular function of SoC 400.

Memory resources in SoC 400 are provided by non-volatile flash memory 410, read-only memory (ROM) 411, and random access memory 412, a portion of each of which is accessible to CPU 430 by way of address bus MAB and data bus MDB. While flash memory 410, ROM 411, and RAM 412 are shown in FIG. 2 as unitary blocks, these memory resources may alternatively be realized as multiple memory blocks or arrays. Particularly in the case of RAM 412, these memory instances may be realized by any one or more of a number of memory cell types and arrangements, including static RAM (SRAM), dynamic RAM (DRAM), ferroelectric memory (FRAM), and the like. In addition, again particularly for the case of RAM 412, it is contemplated that individual instances of memory resources may have any one of a number of access architectures, including single-port and double-port access types.

Various peripheral functions may be also coupled to buses MAB, MDB, so as to be accessible to CPU 430 and one another. In the architecture of FIG. 2, these peripherals include various signal processing functions, such as analog-to-digital (ADC) and digital-to-analog (DAC) converter, communications ports, timers, a "brownout" protection function, serial and other interface functions, and the like. These various peripheral functions may be within the address space of SoC 400, as suggested by their accessibility via buses MAB, MDB; alternatively, one or more of these or other functions may be accessible to CPU 430 directly or via other functional circuitry, as known in the art. Security features may also be realized within SoC 400, for example by way of secure state machine 448 in combination with stored security parameters in secure flash memory 440 and secure tag hardware 446 so as to execute features such as preventing data reads or writes to areas of memory that are specified to be secure areas unless a secure mode is enabled. SoC 400 also includes other functions such as its clock system, as well as emulation system 420 and JTAG interface 421 for debug and emulation, as known in the art.

Figure 1:
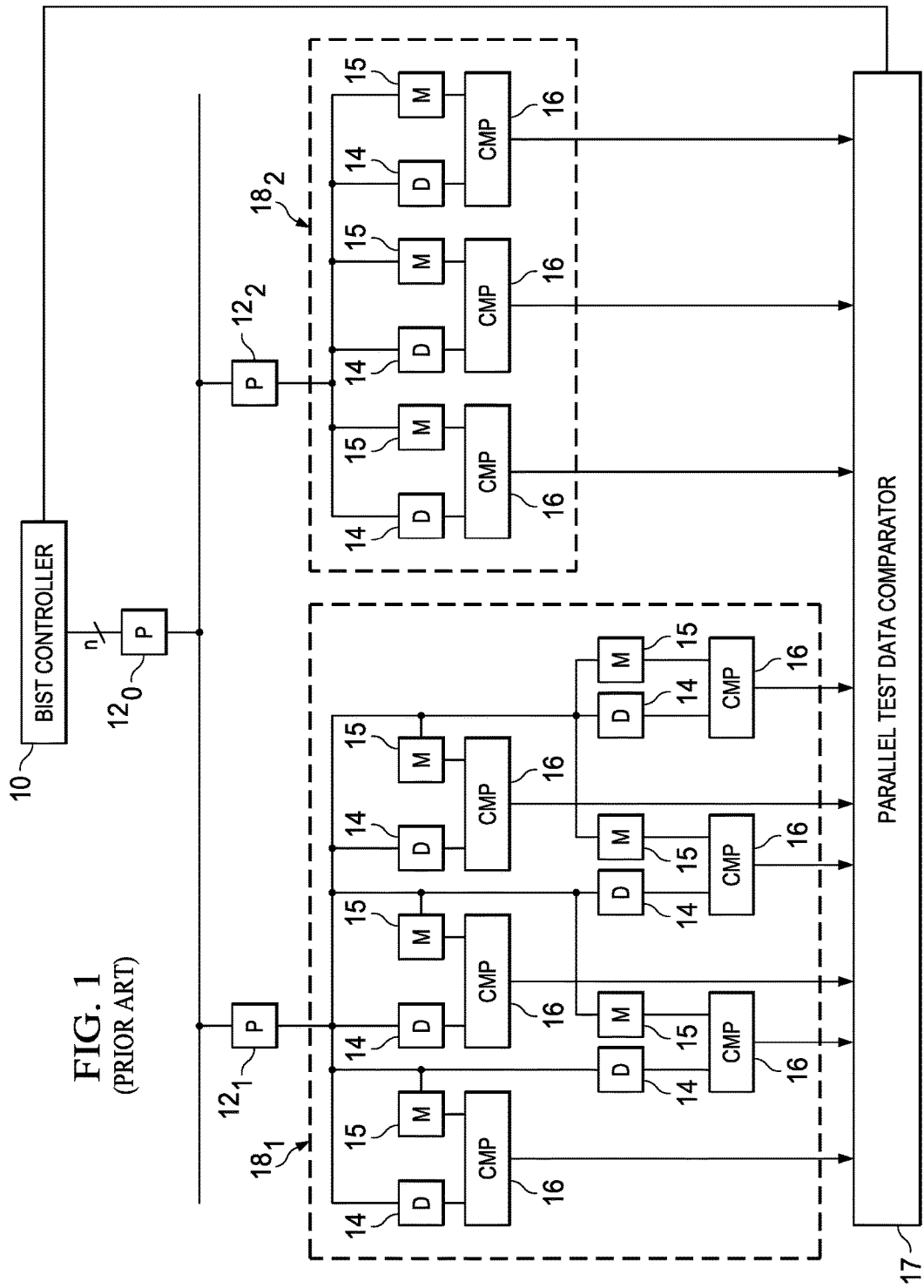
FIG. 1 is an electrical diagram, in block form, of a conventional built-in self-test (BIST) data path architecture for the parallel test of embedded memories in a system-on-a-chip (SoC).

Those skilled in the art having reference to this specification will recognize that SoC 400 may include additional or alternative functions to those shown in FIG. 2, or may have its functions arranged according to a different architecture from that shown in FIG. 1.

In addition to the various memory resources 410, 411, 412 that are accessible via address bus MAB and data bus MDB, it is contemplated that many of the circuit functions within SoC 400 may themselves include local memory resources that are not directly accessible to CPU 430. For example, digital functions such as the various interfaces, state machines (e.g., SM 448), timers, and the like can include blocks of RAM for data storage, or even flash memory or ROM for storage of configuration data or program instructions. Especially for those functions that operate largely in the digital domain, these memory resources may collectively, if not individually, occupy significant chip area in SoC 400. As mentioned above, it is important to also functionally test these memory resources, even though they may not be directly accessible to CPU 430 via buses MAB, MDB or otherwise. CPU 430 itself may also include local memory resources, for example one or more levels of cache memory as known in the art.

In a more general sense, it is contemplated that the various memory resources and other functions in the architecture of SoC 400 may not be physically realized in the arrangement shown in FIG. 2, but may instead be placed at various locations within the integrated circuit. In this regard, those memory resources and other functions may in fact be physically (and logically, for that matter) distributed as multiple instances of SoC 400. These and other variations in the arrangement of SoC 400 that will be apparent to those skilled in the art having reference to this specification are contemplated to be within the scope of this disclosure.

According to these embodiments, SoC 400 includes built-in self-test (BIST) circuitry 450, which controls the execution of self-test program routines for SoC 400. It is contemplated that BIST 450 may have an external interface so as to receive commands from automated test equipment (not shown), and to communicate test results in response. Additionally or in the alternative, BIST 450 may perform a self-test function upon power-up of SoC 400, as known in the art. In any case, according to these embodiments, BIST 450 is coupled to memory resources 410, 411, 412, and other functions of SoC 400 that include local memory, including CPU 430 in this example. As shown in FIG. 2, BIST 450 is coupled to these other memories and functions by way of BIST data path BIST_DP. Data path BIST_DP is separate and independent of buses MAB, MDB, and as such is able to directly access local memory arrays and other local functions that may not be accessible to CPU 430 over the data path of buses MAB, MDB, by way of which data are communicated during the normal operation of SoC 400. And as will be described in further detail below, it is contemplated that BIST data path BIST_DP will not only include conductors arranged as data and control buses, but will also include various circuit functions as will be used in the BIST of the memory resources of SoC 400.

Figure 3:
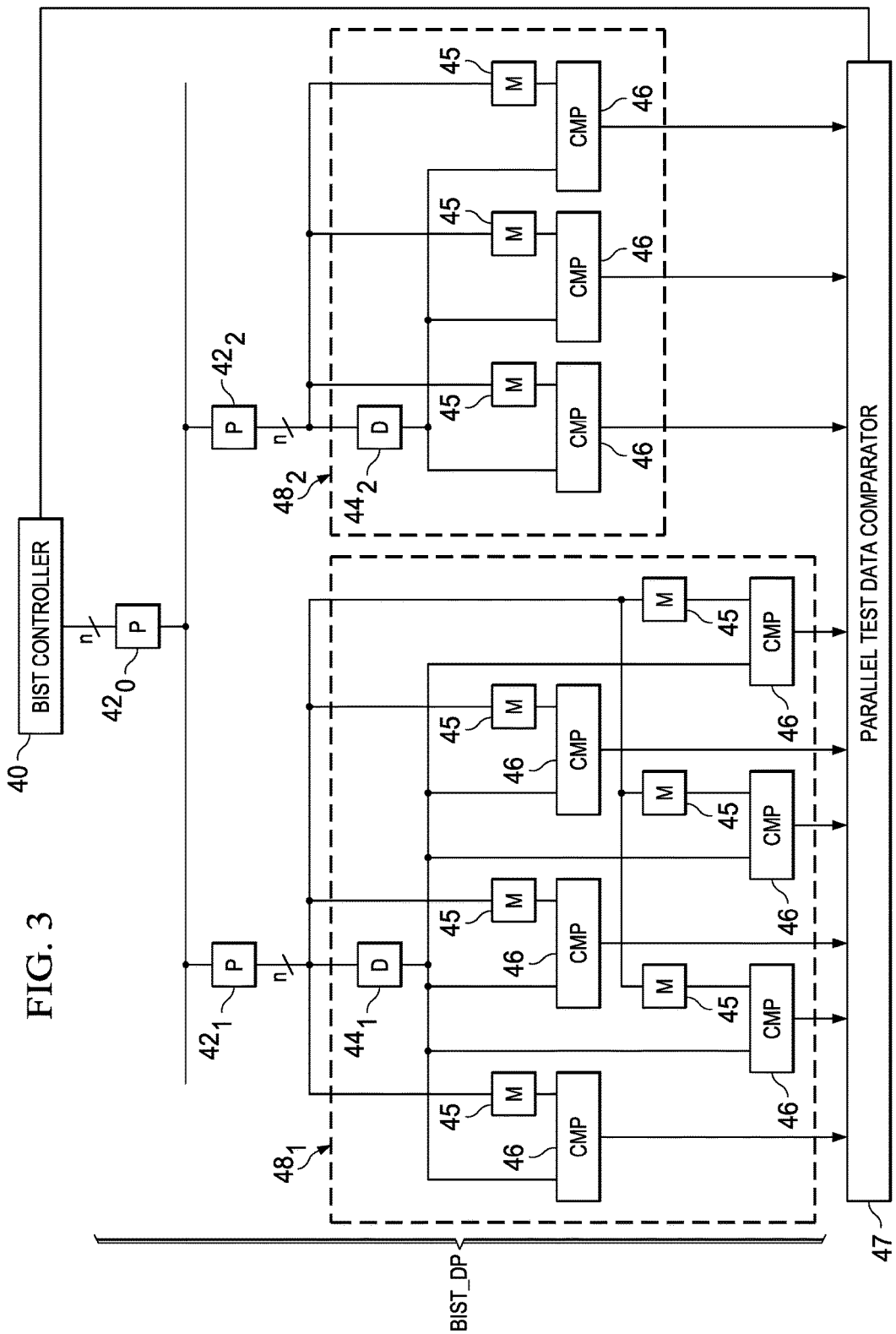
FIG. 3 is an electrical diagram, in block form, of the architecture of BIST circuitry and a BIST data path for the parallel test of embedded memories in the SoC of FIG. 2, according to embodiments.

Referring now to FIG. 3, the architecture of a portion of BIST circuitry 450 and its associated BIST data path BIST_DP according to an embodiment will now be described. The portion of the BIST functionality of SoC 400 shown in FIG. 3 is that which carries out the parallel test of several memories 45 of the same memory type, for example single-port SRAM; of course, the BIST architecture involved with the testing of other memory types such as double-port memory, non-volatile memory, and the like may be similarly constructed. This constraining of parallel test to groups of embedded memories of the same type enables the test data patterns and address patterns for those memories to be simultaneously generated; the test patterns for different memory types will generally differ by type. In the architecture of FIG. 3 according to this embodiment, BIST controller 40 is realized within BIST 450, and is constructed of logic circuitry for generating the desired test data pattern and address sequences that are to be applied, in parallel, to its associated memories 45 in carrying out the test. Multiple BIST controllers 40 may be provided within BIST 450, to similarly control the parallel test of other groups of memories 45, for example those of different memory type or architecture. Alternatively or additionally, multiple BIST controllers 40 for the same memory type may be provided, if desired.

In this example, the test data pattern generated by BIST controller 40 is in the form of a sequence of parallel data words of a width corresponding to the widest data word width among the embedded memories 45 with which this BIST controller 40 is associated. As mentioned above, in modern SoC devices, memories can support a data word of up to 128 bits, if not wider. Bit-wise "masks" may be applied downstream in BIST data path BIST_DP as appropriate for the testing of embedded memories 45 of smaller data word widths. This test data pattern is communicated by BIST controller to its memories 45 by way of one or more pipeline delay stages 42 within BIST data path BIST_DP. As in the conventional arrangement described above, each pipeline delay stage 42 according to this embodiment may be constructed as one or more clocked buffer stages, to delay the propagation of a test data word at its input for one or more system clock cycles (i.e., the number of buffer stages in that pipeline delay stage 42). It is contemplated that the delay inserted by a pipeline delay stage 42 will typically correspond to the delay of one or more pipeline stages in the execution flow of SoC 400.

In this embodiment, similarly as in the conventional architecture of FIG. 1, pipeline delay stages 42 may be shared by those embedded memories 45 that are in the general vicinity of one another and that are to be tested in parallel with one another. For the example of FIG. 3, pipeline delay $42_0$ is shared by all embedded memories 45, while pipeline delay $42_1$ is shared by embedded memories 45 of group $48_1$ that are in the general vicinity of one another, and pipeline delay $42_2$ is shared by embedded memories 45 in group $48_2$ that are in the general vicinity of one another. In this manner, the placement and use of pipeline delay stages 42 can be considered to be "physically aware". The total number of pipeline stages 42 that are in BIST data path BIST_DP is selected so that the parallel memory test can be carried out at the full operating speed of embedded memories 45, in normal operation.

The output of the last of pipeline stages 42 in BIST data path BIST_DP for a given group of embedded memories 45 is coupled to each of the memories in that group. For example, the output of pipeline delay stage $42_1$ is coupled to embedded memories 45 in group $48_1$.

Figure 4:
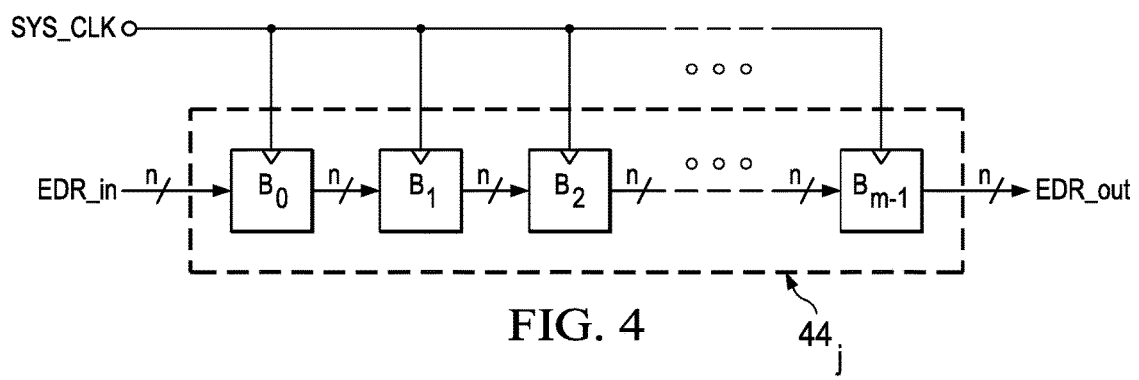
FIG. 4 is an electrical diagram, in block form, of the construction of a shared local response delay generator in the architecture of FIG. 3, according to embodiments.

According to this embodiment, a shared local delay response generator 44 is inserted into BIST data path BIST_DP for each group 48 of embedded memories 45, at a point following the last of the pipeline delay stages 42 for that group. The output of this shared local delay response generator 44 is directly coupled to local comparators 46 associated with those embedded memories 45 in its group 48, with no additional dedicated delay response generators or other delay in BIST data path BIST_DP between shared local delay response generator 44 and any of its associated local comparators 46. FIG. 4 illustrates the functional arrangement of an instance of shared local delay response generator $44_j$, by way of example. In this generalized architecture, shared local delay response generator $44_j$ includes m buffer stages $B_0$ through $B_{m-1}$ (m≥1), each clocked by a clock signal such as system clock SYS_CLK. As a result, expected data word EDR_in, of a width of n bits, is delayed by a time corresponding to m cycles of system clock SYS_CLK before appearing as expected data word EDR_out, for application to its associated local comparators 46.

According to this embodiment, shared local delay response generator 44 provides the entirety of the local delay in the expected response data applied to local comparators 46 for the embedded memories 45 in the associated group. Conversely, no additional local delay response generator that is dedicated to a particular embedded memory 45 within that group is present in this architecture. As a result, shared local delay response generator 44 is shared by those embedded memories 45 in SoC 400 that have essentially the same latency as one another. This allows shared local delay response generator 44 to provide the same delay in the expected data response for each memory 45 in that group 48; in other words, the expected data response is applied by shared local delay response generator 44 simultaneously to each of the local comparators 46 in that group 48. In a general sense, the latency time of these memories 45 includes such factors as the operational timing (e.g., read access time) of those memories 45, and other local delays such as those corresponding to the physical length of the data path to those memories 45. In operation, the delay in the expected data response inserted by shared local delay response generator 44 ensures that the expected data response is applied to local comparators 46 at the correct time for those local comparators 46 to compare the output of their associated embedded memories 45 with the corresponding expected response, in parallel with one another. Each local comparator 46 generates a pass/fail signature from the results of these comparisons in the memory test algorithm, and forwards that pass/fail signature to parallel test data comparator 47, which combines the results from local comparators 46 into data for return to BIST controller 40 for this memory type.

As evident from FIG. 3, multiple groups $48_1$, $48_2$ of embedded memories 45 that are associated with this instance of BIST controller 40 can be tested either sequentially relative to one another, or in parallel with one another. In this example, shared local delay response generator $44_2$ for embedded memories 45 in group $48_2$ can insert a different delay into the expected data response for its local comparators 46 than that inserted by local delay response generator $44_1$ for group $48_1$. In some cases, the inserted delay by these local delay response generators 44 may be the same delay, but the physical distance between the groups $48_1$, $48_2$ may be such that a single shared local delay response generator 44 would not work.

The sharing of a single local delay response generator 44 among multiple embedded memories 45 according to this embodiment significantly reduces the chip area required to implement parallel memory test in this BIST context. As discussed above, the area required to implement dedicated local delay response generators for each embedded memory can be significant, especially for wide data words. In this embodiment, however, this chip area is reduced by the number of embedded memories 45 that can share an instance of shared local delay response generator 44. This area savings is especially significant in those devices in which the memory data path is extremely wide, such as on the order of 128 bits or more. For example, one modern SoC device includes as many as twelve instances of 128 bit wide memory that can share a single local delay response generator, resulting in an area reduction of nearly 60% for the memory data path in that device as compared with the conventional BIST architecture with dedicated delay response generators for each memory, such as discussed above relative to FIG. 1.

These embodiments thus enable the efficient implementation of parallel memory test within a BIST framework in very large-scale integrated circuits such as SoC devices, even where many embedded memory arrays and functions are widely distributed throughout the device. The reduction of chip area provided by these embodiments permit this parallel memory test, even in devices for which the chip area are severely constrained, for example due to packaging requirements. Parallel testability, even of deeply embedded memories (i.e., not directly accessible to the CPU of the device), is thus provided in a cost-effective manner. In addition, these embodiments permit the parallel memory test to be performed at the full operating speed of the memories, ensuring a thorough and complete test of embedded memories.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A system comprising:
   a first group of memories;
   a controller to generate a test data pattern to be applied to at least the first group of memories;
   a first group of comparators, each of which is associated with a respective memory of the first group of memories; and
   a first delay response generator including an input to receive the test data pattern from the controller and an output to output a first expected data response corresponding to the test data pattern to the first group of comparators after a first delay, wherein the output of the first delay response generator is coupled in common to a respective input of each comparator of the first group of comparators so that the first expected data response is applied to all comparators of the first group of comparators via the output of the first delay response generator in response to the output of the first delay response generator outputting the first expected data response.

2. The system of claim 1, further comprising:
   a second group of memories, wherein the test data pattern generated by the controller is to be additionally applied to the second group of memories;
   a second group of comparators, each of which is associated with a respective memory of the second group of memories; and
   a second delay response generator including an input to receive the test data pattern from the controller and an output to output a second expected data response corresponding to the test data pattern to the second group of comparators after a second delay, wherein the output of the second delay response generator is coupled in common to a respective input of each comparator of the second group of comparators so that the second expected data response is applied to all comparators of the second group of comparators via the output of the second delay response generator in response to the output of the second delay response generator outputting the second expected data response.

3. The system of claim 2, further comprising:
   a first pipeline stage to forward the test data pattern from the controller to the first group of memories and the first delay response generator; and
   a second pipeline stage to forward the test data pattern from the controller to the second group of memories and the second delay response generator.

4. The system of claim 3, further comprising:
   a third pipeline stage to forward the test data pattern from the controller to each of the first and second pipeline stages, the third pipeline stage being coupled in common to the first and second pipeline stages.

5. The system of claim 2, wherein at least some of the memories of the first and second groups of memories are embedded memories of an integrated circuit.

6. The system of claim 5, wherein the integrated circuit comprises a microcontroller, a processor, or a system-on-a-chip (SoC).

7. The system of claim 2, wherein the memories of the first and second groups of memories are of the same memory type.

8. The system of claim 2, wherein the same memory type is either random access memory (RAM) or non-volatile memory.

9. The system of claim 1, wherein the test data pattern generated by the controller has a selected data word width that corresponds to the widest data word width of the memories of the first group of memories.

10. The system of claim 1, wherein the controller is a built-in-self-test (BIST) controller.

11. A system comprising:
    a first group of memories, the memories of the first group being of a first memory type;
    a first controller to generate a first test data pattern to be applied to the first group of memories;
    a second group of memories, the memories of the second group being of a second memory type;
    a second controller to generate a second test data pattern to be applied to the second group of memories;
    a first group of comparators, each of which is associated with a respective memory of the first group of memories;
    a first delay response generator including an input to receive the first test data pattern from the first controller and an output to output a first expected data response corresponding to the first test data pattern to the first group of comparators after a first delay, wherein the output of the first delay response generator is coupled in common to a respective input of each comparator of the first group of comparators so that the first expected data response is applied to all comparators of the first group of comparators via the output of the first delay response generator in response to the output of the first delay response generator outputting the first expected data response;
    a second group of comparators, each of which is associated with a respective memory of the second group of memories; and
    a second delay response generator including an input to receive the second test data pattern from the second controller and an output to output a second expected data response corresponding to the second test data pattern to the second group of comparators after a second delay, wherein the output of the second delay response generator is coupled in common to a respective input of each comparator of the second group of comparators so that the second expected data response is applied to all comparators of the second group of comparators via the output of the second delay response generator in response to the output of the second delay response generator outputting the second expected data response.

12. The system of claim 11, wherein:

the first memory type corresponds to single-port memory; and the second memory type corresponds to double-port memory.

13. The system of claim 11, wherein:

the first memory type corresponds to random access memory; and the second memory type corresponds to non-volatile memory.

14. The system of claim 11, wherein:

the first memory type is selected as one of static RAM (SRAM), dynamic RAM (DRAM), ferroelectric RAM (FRAM), flash memory, or read-only memory (ROM); and the second memory type is selected as another one of SRAM, DRAM, FRAM, flash memory, or ROM that is not selected as the first memory type.

15. The system of claim 11, wherein at least some of the memories of the first group of memories or the second group of memories are embedded memories of an integrated circuit.

16. The system of claim 15, wherein the integrated circuit comprises a microcontroller, a processor, or a system-on-a-chip (SoC).

17. The system of claim 11, wherein the first and second controllers are built-in-self-test (BIST) controllers.

18. The system of claim 11, wherein:

the first test data pattern generated by the first controller has a first selected data word width that corresponds to the widest data word width of the memories of the first group of memories; and the second test data pattern generated by the second controller has a second selected data word width that corresponds to the widest data word width of the memories of the second group of memories.

19. The system of claim 11, wherein the first delay corresponds to a memory access latency of the memories in the first group, and the second delay corresponds to a memory access latency of the memories in the second group.

* * * * *